US009362898B2

(12) United States Patent
Chandernagor et al.

(10) Patent No.: US 9,362,898 B2
(45) Date of Patent: Jun. 7, 2016

(54) RF POWER DETECTOR AND DETECTION METHOD

(71) Applicant: NXP B.V., Eindhoven (NL)

(72) Inventors: Lucie Chandernagor, Caen (FR); Patrick Jean, Carcagny (FR)

(73) Assignee: NXP B.V., Eindhoven (NL)

( * ) Notice: Subject to any disclaimer, the term of this patent is extended or adjusted under 35 U.S.C. 154(b) by 97 days.

(21) Appl. No.: 14/478,780

(22) Filed: Sep. 5, 2014

(65) Prior Publication Data

US 2015/0091630 A1 Apr. 2, 2015

(30) Foreign Application Priority Data

Sep. 30, 2013 (EP) .................................... 13290233

(51) Int. Cl.
*H03L 5/00* (2006.01)
*H03K 5/003* (2006.01)
*H03F 3/19* (2006.01)
*H03F 3/45* (2006.01)
*H04B 10/69* (2013.01)

(52) U.S. Cl.
CPC .................. *H03K 5/003* (2013.01); *H03F 3/19* (2013.01); *H03F 3/45995* (2013.01); *H04B 10/6933* (2013.01)

(58) Field of Classification Search
CPC ....... H03K 5/003; H03F 3/45995; H03F 3/19; H04B 10/6933
USPC ............................................... 327/307; 330/9
See application file for complete search history.

(56) References Cited

U.S. PATENT DOCUMENTS

| 5,404,585 | A * | 4/1995 | Vimpari ................... H03D 1/18 330/296 |
| 6,204,727 | B1 * | 3/2001 | Wey ....................... H03G 3/3047 324/119 |
| 6,373,236 | B1 * | 4/2002 | Lemay, Jr. ............. G01R 21/10 323/369 |
| 7,113,754 | B2 * | 9/2006 | Chien .................. H04B 17/318 327/58 |
| 7,504,813 | B2 * | 3/2009 | Manstretta ............... H03D 1/18 323/312 |

(Continued)

FOREIGN PATENT DOCUMENTS

EP 0 843 420 A1 5/1998
EP 1 026 822 A2 8/2000

OTHER PUBLICATIONS

Durante, Marco Spinola et al; "An ultra low power Wakeup Receiver for Wireless Sensor Nodes"; IEEE Third International Conference on Sensor Technologies and Applications; pp. 167-170 (2009).
Extended European Search Report for application No. 13290233.9 (Mar. 14, 2014).

*Primary Examiner* — Kenneth B Wells (57) ABSTRACT

The invention provides an RF detection circuit and method using an envelope detector having an output connected to a first input of a differential amplifier and a reference storage capacitor to a second input of the differential amplifier. In a preferred implementation of the calibration mode, there is initial discharging of a reference storage capacitor, high speed charging of the reference storage capacitor until the differential amplifier output toggles, then slower discharging of the reference storage capacitor until the differential amplifier output toggles again. The resulting voltage is stored on the reference storage capacitor for use in a subsequent detection mode. This provides storage of an offset voltage which calibrates both the envelope detector differential amplifier functions.

15 Claims, 5 Drawing Sheets

(56) References Cited

U.S. PATENT DOCUMENTS

| | | | |
|---|---|---|---|
| 7,659,707 B2* | 2/2010 | Eken | G01R 21/01 324/123 R |
| 8,022,688 B2* | 9/2011 | You | G01R 21/002 324/123 C |
| 8,301,091 B2* | 10/2012 | Vice | H03F 1/0277 455/127.3 |
| 8,385,860 B2* | 2/2013 | Teraguchi | G01R 21/10 455/115.1 |
| 8,598,866 B2* | 12/2013 | Huang | G01R 21/12 324/119 |

* cited by examiner

RF POWER DETECTOR AND DETECTION METHOD

CROSS-REFERENCE TO RELATED APPLICATIONS

This application claims the priority under 35 U.S.C. §119 of European patent application no. 13290233.9, filed on Sep. 30, 2013, the contents of which are incorporated by reference herein.

FIELD OF THE INVENTION

The invention relates to RF power detectors, and in particular for use in low power RF receivers.

BACKGROUND OF THE INVENTION

In the design of low-power receivers there are several constraints. The main one is to reach the best possible performance while consuming the least power possible.

To insure a low power consumption, the design must be as simple as possible. Direct detection (i.e. without intermediate frequency processing, and conversion to baseband in a single step) is the simplest kind of demodulation chain and also the one which consumes the least power.

However, the detected signal is typically not strong enough to allow demodulation, so that it must be amplified.

The low-power circuitry imposes a second main constraint which is the leakage current.

By way of example, a typical desired targeted current consumption of a receiver can be in the range of a few µA, and the temperature range over which it must operate can range from −55° C. up to 125° C. A submicron CMOS process is for example used for this circuit.

In order to achieve a high detection gain, an active RF detector is used. The principle of operation of this type of detector relies on the non-linear transfer characteristic of active device. For example, an exponential relationship governs MOS transistors in the weak inversion regime.

Unlike detectors realised with isolated diodes, this type of active detector does not provide easily complementary signals. These signals are nevertheless very useful in order to insure high gain amplification (DC offset cancellation). There is therefore a need to generate a reference voltage with which the detected signal will be compared in order to generate a differential output, in particular using a differential amplifier. This presents a first problem in the circuit design.

A second problem relates to the DC offset of the differential amplifier that processes the detected signal and its reference. This DC offset depends on process parameters and mismatch between components. A wrong differential voltage applied to the inputs of the differential amplifier can result in the output being locked to a high or low value. In this case, the signal is lost.

The applied differential voltage must be adjusted taking into account process and mismatch variations to insure the proper operation of the system.

Usually the problems outlined above are solved independently. To solve the problem of incompatibility between a single output detector and a differential input amplifier, an envelope detector with two outputs can be used. One output provides the detected signal and the second one provides a voltage level which is used as a reference.

Unfortunately this kind of design requires duplication of the detector circuit, and therefore its associated current consumption.

The DC offset issue of the amplifier is generally minimized by using large components which in practice are not suitable for ultra-low-power circuitry. Indeed these components occupy a large silicon area. Apart from cost, this makes them subject to significant current leakage that could be of the same order of magnitude of their own current consumption. This prevents a proper operation.

SUMMARY OF THE INVENTION

The invention is defined by the claims.

According to one aspect of the invention, there is provided an RF detector circuit, comprising:

an envelope detector having an output capacitor on which an envelope detection signal is provided;

a reference storage capacitor for storing a reference voltage;

a differential amplifier having a first input coupled to the output capacitor (Cm) and a second input coupled to the reference storage capacitor (Cref);

a reset circuit;

a charging circuit for charging reference storage capacitor Cref at a first rate; and a discharge circuit for discharging the reference storage capacitor (Cref) at a second, different, rate;

a controller, for controlling the sequence of charging and discharging the reference storage capacitor to store an amplifier offset voltage on the reference storage capacitor based on toggling of the amplifier output during the charging or discharging operation which has the slower rate.

This circuit can provide a receiver chain in the form of a direct receiver envelope detector and a voltage reference generating circuit, which together feed a differential amplifier.

The circuit is adapted to memorise a DC voltage level. A reference storage capacitor is used for this purpose. The voltage level is adjusted by the circuit in such a way that it fits with the characteristics of the amplifier. This voltage is then used as a reference voltage applied to one of the inputs of the amplifier. The circuit in this way provides combined calibration of the detector and the amplifier. The calibration is organized in at least two phases, of charge and discharge.

The capacitor can be charged quickly then slowly discharged to implement a coarse and then fine threshold sampling of the amplifier, so that the first rate is greater than the second rate.

Preferably, the reset circuit comprises an initial discharge circuit for discharging the reference storage capacitor.

The circuit then operates in three phases; an initial discharge, high speed charge and low speed discharge. By performing the fine threshold sampling on a dropping (discharge) voltage, the desired polarity signal is sampled.

The envelope detector circuit may comprise a transistor with the input signal applied to the transistor gate, and connected to a power rail through a load resistor, and an output smoothing capacitor connected to a node between the transistor and the load resistor.

The initial discharge circuit preferably comprises a switch between the reference storage capacitor and ground. This enables a rapid initial discharge function to provide a reset.

The discharge circuit preferably comprises a current source driving a current to ground, and an isolation switch enabling the current source to be selectively coupled to the reference storage capacitor. In the preferred example, the circuit performs a relatively low speed discharge so that in the amplifier response time there is little change in the differential voltage across the amplifier inputs. A suitable offset voltage can then be determined and stored on the reference storage capacitor.

The charging circuit can comprise a current source, driving a current to the reference storage capacitor, when enabled by a switch. In the preferred example, this implements a high speed charge. For example, the charging circuit current source can have a current delivery of at least 50 times the current delivery of the current source of the discharge circuit.

More generally, one current source delivers a current of more than 50 times the other. A fast charge is followed by a slow discharge, or else a fast discharge is followed by a slow discharge.

An input switch is preferably provided for connecting the circuit input to ground for a calibration mode, or to an RF input for a receive mode. Thus, the calibration mode takes place without reception of data.

The controller is preferably for controlling the timing of operation of switches which control the (or each) discharge circuit and the charging circuit. The timing determines when the charging and discharging operations start and finish, and enable the desired offset to be stored on the reference storage capacitor.

The envelope detector output is preferably connected to the inverting input of the differential amplifier and the reference storage capacitor is then connected to the non-inverting input of the differential amplifier.

The invention also provides an RF detection method, using an RF detector circuit which comprises an envelope detector having an output connected to a first input of a differential amplifier and a reference storage capacitor to a second input of the differential amplifier, the method comprising:
  in a calibration mode:
  coupling an input of the RF detector circuit to a reference potential;
  performing a reset operation of the voltage on the reference storage capacitor;
  charging the reference storage capacitor (Cref) at a first rate until the differential amplifier output toggles and discharging the reference storage capacitor (Cref) at a second lower rate until the differential amplifier output toggles, or discharging the reference storage capacitor (Cref) at a first rate until the differential amplifier output toggles and charging the reference storage capacitor (Cref) at a second lower rate until the differential amplifier output toggles; and
  storing the resulting voltage on the reference storage capacitor; and in a detection mode:
  coupling the input of the RF detector circuit to a signal to be detected.

In a preferred example, the reset is an initial discharge, there is a high speed charge and then a slower speed discharge.

BRIEF DESCRIPTION OF THE DRAWINGS

An example of the invention will now be described in detail with reference to the accompanying drawings, in which.

DETAILED DESCRIPTION

The invention provides an RF detection circuit and method using an envelope detector having an output connected to a first input of a differential amplifier and a reference storage capacitor to a second input of the differential amplifier. In one example of the calibration mode, there is initial resetting of a reference storage capacitor, then high speed charging or discharging of the reference storage capacitor until the differential amplifier output toggles. There is then slower discharging or charging of the reference storage capacitor until the differential amplifier output toggles again. The resulting voltage is stored on the reference storage capacitor for use in a subsequent detection mode. This provides storage of an offset voltage which calibrates both the envelope detector differential amplifier functions.

Figure 1:
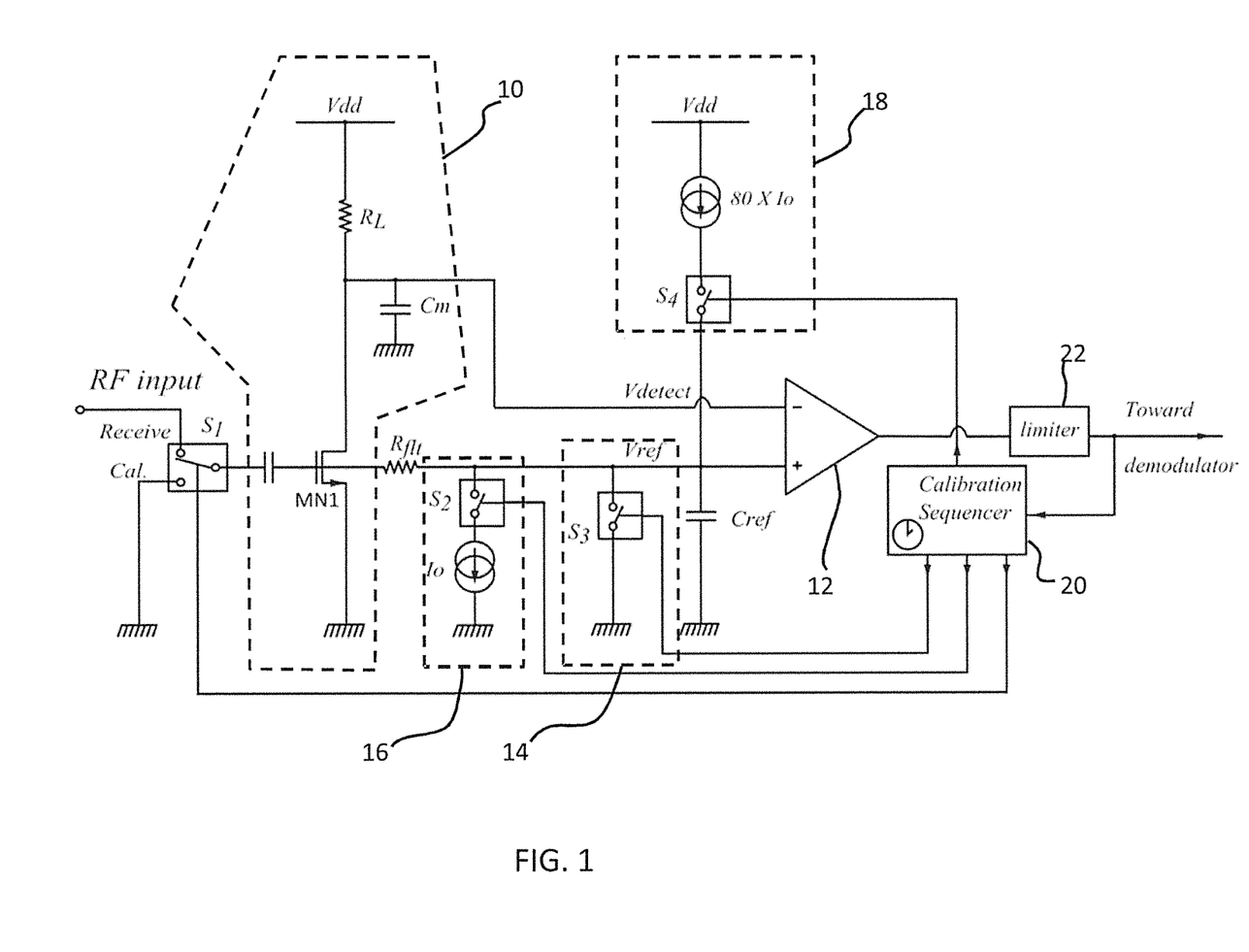
FIG. 1 shows an example of circuit of the invention.

FIG. 1 shows an example of the circuit of the invention. This preferred example uses a high speed charge followed by a slow speed discharge. The RF input is received through a switch S1, which either passes the RF input or else connects the input to ground, in particular for a calibration operation before the circuit is used for RF reception.

The circuit comprises a RF envelope detector circuit 10 which provides the detected envelope signal to the inverting input of a low frequency amplifier 12. The non-inverting input of the low frequency amplifier 12 has a reference voltage applied to it, held on a reference storage capacitor Cref. The invention relates in particular to the circuit and method for providing the appropriate voltage on the reference storage capacitor.

A reset circuit 14 takes the form of a first discharge circuit 14 for discharging the storage capacitor Cref as quickly as possible, in the form of a switch S3 to ground.

A second (controlled) discharge circuit 16 is provided to give a controlled discharge of the storage capacitor as explained below. It comprises a series connection of a current source delivering a current Io and switch S2, between the non-inverting input and ground.

A charging circuit 18 is provided for charging the storage capacitor Cref from the high voltage rail Vdd, in the form of a current source in series with a switch S4.

The envelope detector circuit 10 can be conventional. In the example of envelope detector shown in FIG. 1, the input RF signal is supplied to an NMOS transistor MN1, and the switching of the transistor MN1 determines whether the output (smoothing) capacitor Cm is charged through a load resistor $R_L$ or discharged through the transistor. In this way, the capacitor Cm provides a smoothing (i.e. low pass filtering) function and thereby provides envelope detection. The voltage stored on capacitor Cm is the envelope signal, and it is provided to the low frequency amplifier 12.

The non-inverting input of the differential amplifier 12 is connected to the gate of the transistor MN1 through a resistor Rflt.

The transistor MN1 functions the RF detector. In order to achieve this function, its gate is fed with the RF signal. The presence of the RF signal modifies (in particular increases) the average current that flows in MN1. This translates to an increased voltage drop in $R_L$.

MN1 is biased in the weak inversion regime of operation in which the exponential relationship between the gate voltage and current allows the detection process to take place.

The bias voltage insuring the weak inversion operation is stored on Cref. The required value for Cref in order to efficiently store this voltage leads to a low RF impedance (a few Ohms) that would "short" the RF signal. To prevent this, high value resistor Rflt is placed between the reference storage capacitor Cref and the gate of MN1 to which the RF voltage is applied. The RF current flows almost exclusively to the gate of MN1. With no DC current flowing through the resistor, there is no effect on the biasing point.

The charging circuit comprises a larger current source, driving a current 80×Io to the storage capacitor, when enabled by switch S4. The larger current source may for example deliver a current at least 50 times the current of the smaller discharge current source.

The four switches S1-S4 control the circuit configuration, and they are controlled by a calibration sequencer 20.

The output of the low frequency amplifier 12 is supplied to a limiter 22 which provides the circuit output. As shown, the calibration sequencer has timing controlled in dependence on the circuit output.

There are four different phases in the operation of the circuit. The first three phases are part of an initial calibration, with switch S1 coupling the circuit input to ground. The transistor MN1 is off, and the smoothing capacitor is thus charged by Vdd through the load resistor $R_L$. The switches S2-S4 then control the different phases of the calibration operation. The final, fourth, phase has the circuit input coupled to the RF input.

A first phase comprises discharge of the storage capacitor Cref. This involves closing only switch S3 to discharge Cref. This initial discharge function performs as a circuit reset. The calibration operation can be carried out many times, for example to respond to changing temperature, circuit ageing, or other conditions. The first phase thus resets the circuit to a fixed state.

A second phase comprises a rapid charging of the storage capacitor Cref, by closing only switch S4. The current source 80×Io charges the storage capacitor Cref through S4. The non-inverting input of the amplifier 12 is connected to the resulting voltage Vref on the reference storage capacitor Cref and the inverting input is connected to the voltage on the drain of transistor MN1. This voltage Vdetect is equal to $Vdd - R_L \times I_D$.

The purpose of this charging phase is to minimize the differential voltage between Vref and Vdetect. The fast charge phase brings the voltage Vref quickly to the toggling point. The amplifier, because of its low current consumption, has a long response time.

During the quick charging of the capacitor, the output of the envelope detector will decrease until it reaches the threshold of the amplifier. This decrease arises because the increase in voltage on Cref gradually turns the transistor MN1 on, and thereby increases the transistor drain current, thereby reducing the Vdetect value. The output of the amplifier toggles when a difference between the inputs is equal to the amplifier threshold voltage.

This toggling of the output is detected by the calibration sequencer, and is used to trigger the start of a low speed discharge. The threshold should ideally be zero, but there is an actual value which originates mainly from component mismatch.

The required time to change the switch configurations at the end of the high speed charge is not critical but it is preferably kept short, because it will impact on the duration of the subsequent low speed discharge step and so the duration of the overall operation.

The toggling point of the amplifier is when the resulting Vdiff crosses the threshold. However, depending on the rate of change of the two input signals relative to each other, the response time of the amplifier (following the point in time when the threshold is crossed) means the difference voltages present between the inputs at the (later) point in time when the output toggles will be dependent on the rate of change of the input.

A very fast charging is carried out so that the threshold voltage is exceeded by a margin, then a slow discharge is carried out to measure more accurately the threshold voltage. The fast charging can be considered to be a coarse threshold sampling operation, and the slow discharging can be considered to be a fine sampling operation. This coarse-fine approach saves time in obtaining an accurate sampling of the threshold voltage.

The second discharge phase, which is carried out more slowly as explained above, involves closing only switch S2. The capacitor is slowly discharged to go back to the previous state (i.e. when the output of the amplifier becomes low again). The slow speed discharge allows the drift of the differential voltage due to its response time to be limited. This insures a small and well-controlled input offset that enables a good sensitivity from the detector. In particular, the voltage Vref on the reference storage capacitor is held at such a point that the offset is small and with the right polarity.

The output voltage of the amplifier is held at Vdd until its input differential voltage reaches its threshold and so its output toggles finishing the overall operation. In this case, the calibration sequencer must change the switch configurations as soon as the output toggles, in order to keep the desired voltage on Cref.

The table below shows the way the switches are controlled for the different sequences of the method.

| Step | S1 | S2 | S3 | S4 |
|---|---|---|---|---|
| 1- Initial discharge | Cal | Opened | Closed | Opened |
| 2- High speed charge | Cal | Opened | Opened | Closed |
| 3- Low speed discharge | Cal | Closed | Opened | Opened |
| 4- End | Receive | Opened | Opened | Opened |

The calibration sequencer 20 manages the switches S1, S2, S3 and S4 during each calibration phase.

Figure 2:
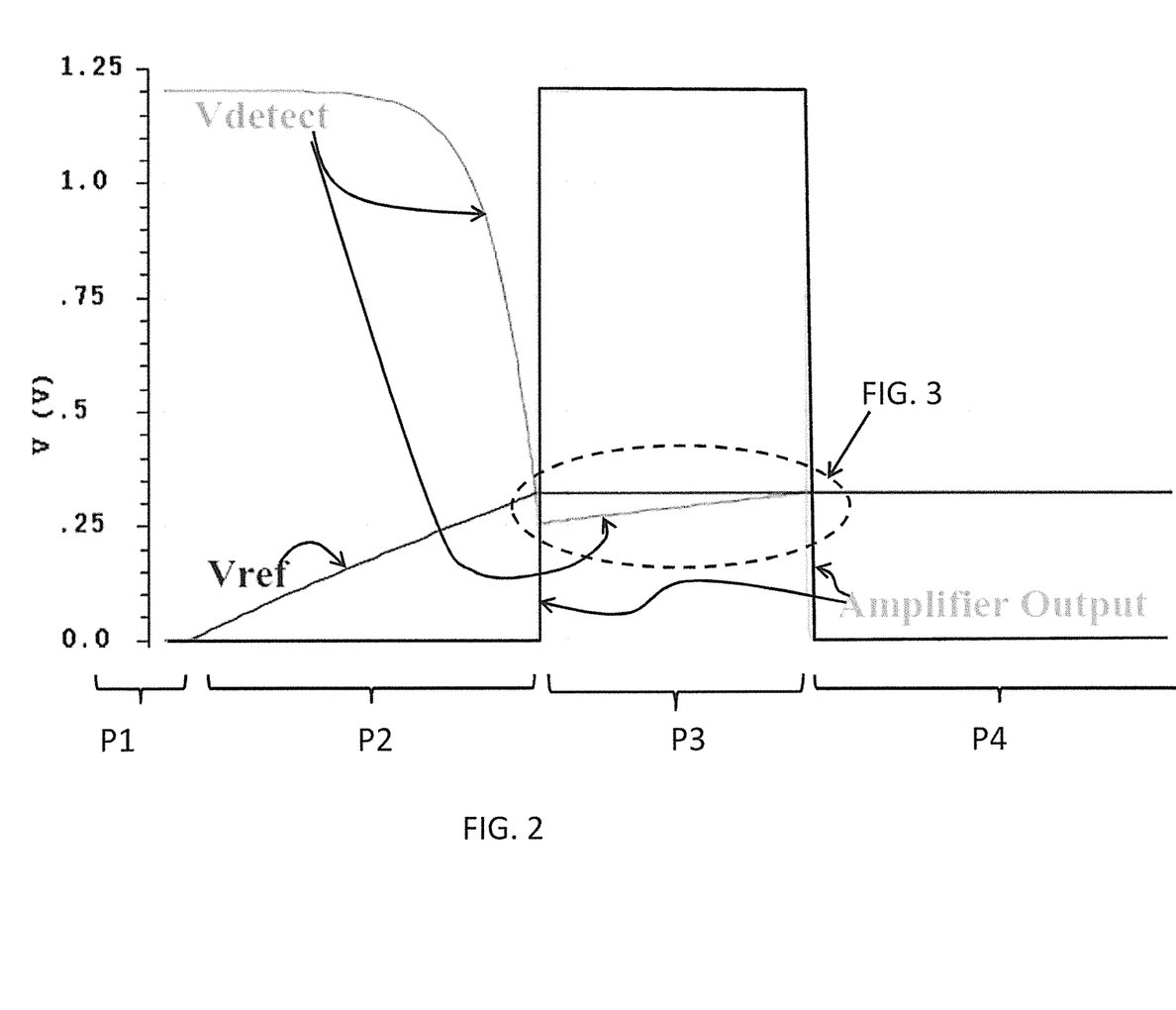
FIG. 2 is a timing diagram to explain the operation of the circuit.

FIG. 2 shows how the voltages Vref, Vdetect and the circuit output evolve during the four phases.

In phase 1 (P1), the reference storage capacitor Cref is discharged. With the transistor MN1 fully off, the voltage Vdetect is equal to Vdd (since no current flows.

In phase 2 (P2), the reference storage capacitor is rapidly charged. Towards the end of the charging, the voltage Vref means the transistor MN1 begins to conduct, causing the voltage Vdetect to drop.

When the difference between Vdetect and Vref is equal to the threshold of the amplifier, the output toggles.

The third phase (P3) then starts, of a slow discharge. This provides a slowly decaying voltage Vref, which gives rise to an increasing value of Vdetect, because the transistor MN1 is gradually turned off, reducing the voltage drop across $R_L$.

Figure 3:
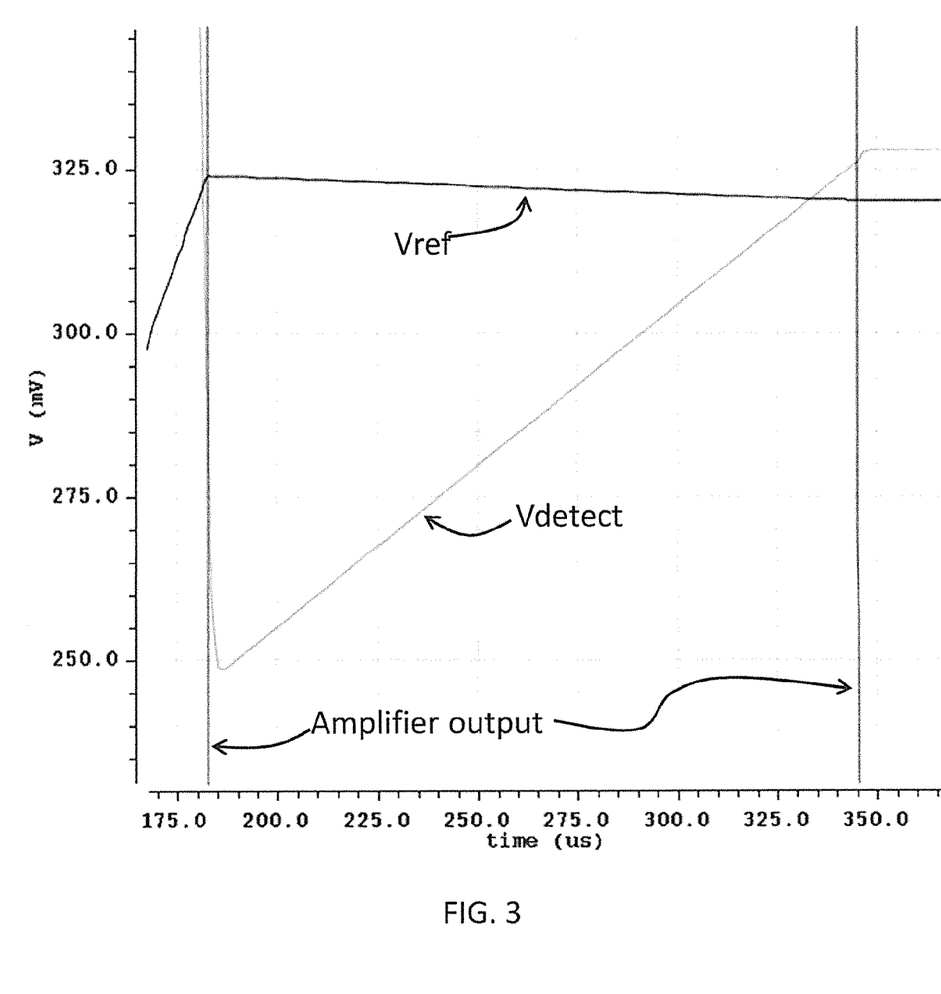
FIG. 3 is a timing diagram to show part of the timing in more detail.

The voltage changes during this phase can be seen more clearly in FIG. 3, which zooms in on the voltage axis for the phase P3. The output toggles again when Vref and Vdetect cross.

The first time the output toggles, there is quite a large difference between Vref and Vdetect due to the response time of the amplifier, as explained above.

The second time there is a much smaller difference which more accurately represents the amplifier threshold voltage.

Figure 4:
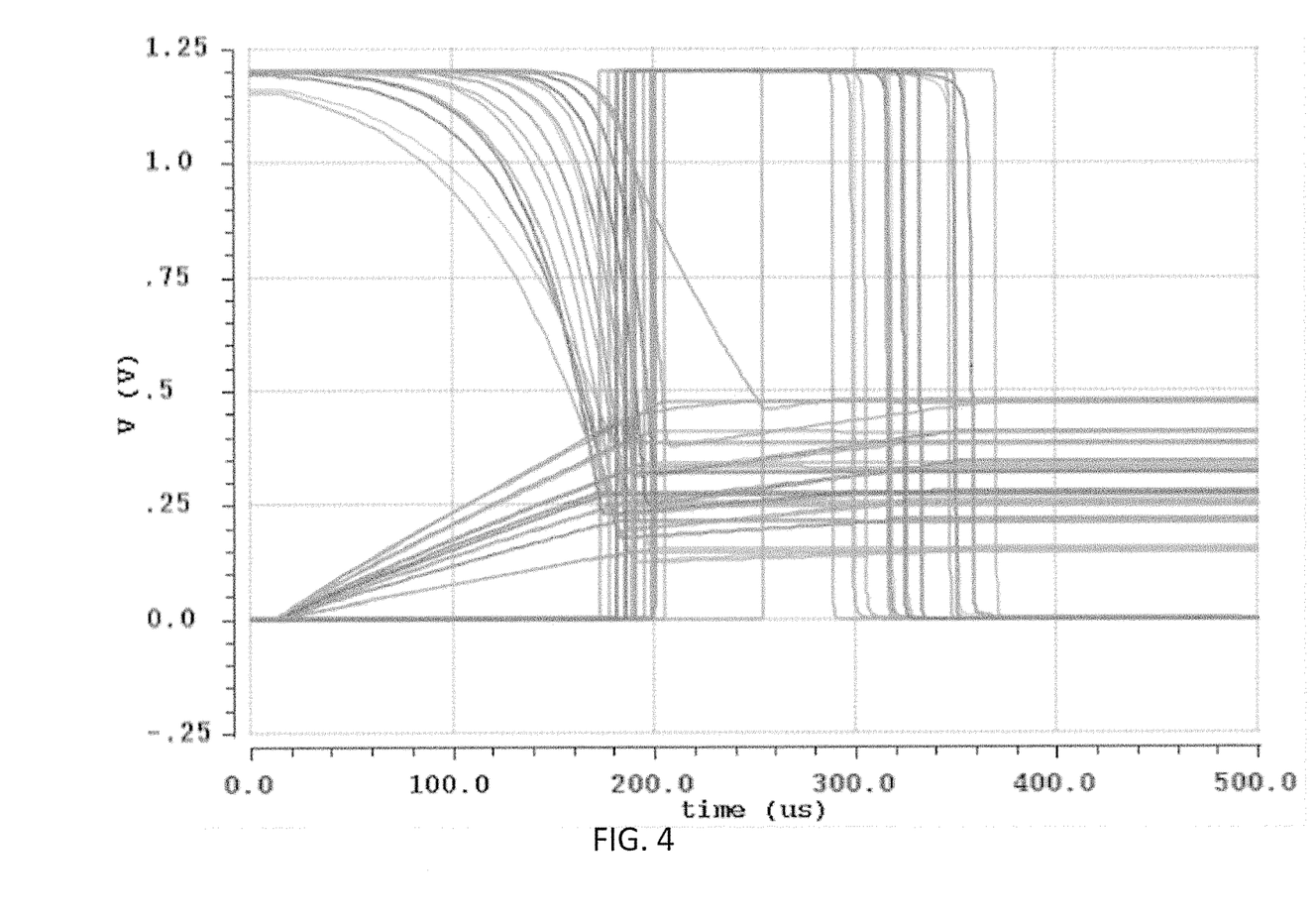
FIG. 4 is a timing diagram corresponding to FIG. 2 but for a range of temperatures.

In order to illustrate the benefit of the circuit, the obtained results for all process variations over a temperature range from −55° C. to 125° C. are shown superposed in the graph of FIG. 4.

The different lines in FIG. 4 are based on circuit observations at only three particular temperatures (the two extremes −55° C. and 125° C., and the ambient temperature 27° C.). The circuit response is observed taking into account each kind of process variations model: FNFP, FNSP, SNFP, SNSP and Nominal, at −55° C., 27° C. and 125° C. (giving 15 curves).

The process variation models used to simulate the circuit behaviour are:

FNSP=faster NMOS and slower PMOS transistors
FNFP=faster NMOS and faster PMOS transistors
SNSP=slower NMOS and slower PMOS transistors
SNFP=faster NMOS and faster PMOS transistors
Nominal=intended NMOS and PMOS transistor speeds.

It has been shown that the calibration process operates properly despite all process variations over all the temperature range.

Figure 5:
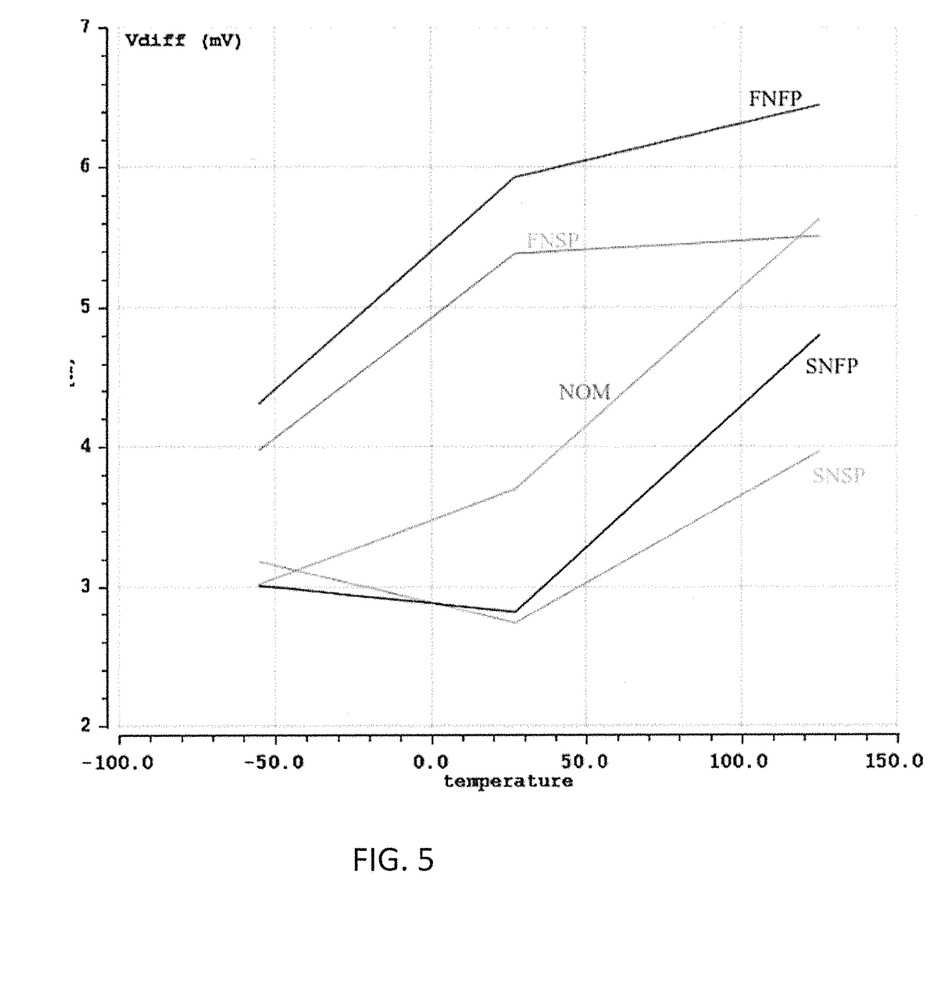
FIG. 5 shows the differential voltage changes with temperature.

FIG. 5 shows a plot of the differential voltage (Vdiff) between Vref and Vdetect such that Vdiff=Vdetect−Vref when the calibration is finished, as a function of temperature, and for the five process variations outlined above.

A differential voltage between 3 mV and 6.5 mV is shown.

The detector has been shown to exhibit a sensitivity that is always better than −50 dBm (i.e. for all process corners and temperature range) and this for a global current consumption of 2 μA.

The latency time resulting from the calibration phase is moderate and has no significant impact on the global receiver response time.

The invention thus addresses the problem caused by amplification of the small DC voltage generated by an active RF detector. An RF detector by nature does not deliver easily complementary signals. Thus DC signal amplification requires some special circuit arrangement. Among others a classical solution to solve this consists in duplicating the detector and using one for detection and the other one as a DC reference for the amplification. This solution has the drawback to double the detector current consumption and to rely on components matching (for offset voltage).

In the case of ultra-low-power consumption to which the invention can be applied, this solution is not applicable. Indeed, good matching properties are not compatible with small components used to prevent current leakage in ultra-low-power circuits. Also, the weak inversion operation that allows very low power operation leads to very poor matching properties.

The invention addresses these two problems by first memorizing the DC voltage provided by the detector in a capacitor when no RF signal is applied. This memorized voltage is used as a reference for the amplification of the detected signal. This allows the use of only one active RF detector and to avoid component matching.

Moreover, examples of the invention also enable the problem of the input offset voltage of the differential amplifier in charge of processing the detected signal to be addressed. For this, the reference voltage is used for biasing the detector. During the calibration process the detector output voltage is swept (by acting on its biasing), and when the amplifier offset is compensated its output toggles. This is used to detect the proper reference voltage that will be memorized.

As mentioned above, different envelope detector designs can be used. It is preferred that direct detection is employed, but this is not essential.

The preferred example described above uses three phases, with the threshold voltage sampled from a slowly falling capacitor voltage.

However, for a detector providing an output signal with an opposite polarity to the circuit shown (i.e. one in which the output voltage of the detector increases in the presence of an RF input), it would then be appropriate for the threshold voltage to be sampled from a slowly rising voltage. Thus, there would then be a fast discharge (from a fully charged initial reset capacitor state) followed by a slow charge.

Various modifications will be apparent to those skilled in the art.

The invention claimed is:

1. An RF detector circuit, comprising:
    an envelope detector having an output capacitor on which an envelope detection signal is provided;
    a reference storage capacitor for storing a reference voltage;
    a differential amplifier having a first input coupled to the output capacitor and a second input coupled to the reference storage capacitor;
    a reset circuit;
    a charging circuit for charging the reference storage capacitor at a first rate; and
    a discharge circuit for discharging the reference storage capacitor at a second, different, rate; and a controller, for controlling the sequence of charging and discharging the reference storage capacitor to store an amplifier offset voltage on the reference storage capacitor based on toggling of the amplifier output during the charging or discharging operation which has the slower rate.

2. A circuit as claimed in claim 1, wherein the envelope detector circuit comprises a transistor with the input signal applied to the transistor gate, and connected to a power rail through a load resistor, and an output smoothing capacitor connected to a node between the transistor and the load resistor.

3. A circuit as claimed in claim 1, wherein the reset circuit comprises an initial discharge circuit for discharging the reference storage capacitor, and wherein the first rate is greater than the second rate.

4. A circuit as claimed in claim 3, wherein the initial discharge circuit comprises a switch between the reference storage capacitor and ground.

5. A circuit as claimed in claim 1, wherein the discharge circuit comprises a current source driving a current to ground, and an isolation switch enabling the current source to be selectively coupled to the reference storage capacitor.

6. A circuit as claimed in claim 5, wherein the charging circuit comprises a current source, driving a current to the reference storage capacitor, when enabled by a switch.

7. A circuit as claimed in claim 6, wherein current source of the faster of the charging circuit and discharging circuit has a current delivery of at least 50 times the current delivery of the slower of the charging circuit and the discharge circuit.

8. A circuit as claimed in claim 1, comprising an input switch for connecting the circuit input to ground for a calibration mode, or to an RF input for a receive mode.

9. A circuit as claimed in claim 1, wherein the controller is for controlling the timing of operation of switches which control the or each discharge circuit and the charging circuit.

10. A circuit as claimed in claim 1, wherein the envelope detector output is connected to the inverting input of the differential amplifier and the reference storage capacitor is connected to the non-inverting input of the differential amplifier.

11. A circuit as claimed in claim 1, wherein the circuit input is connected to the non-inverting input of the differential amplifier through a resistor.

12. An RF detection method, using an RF detector circuit which comprises an envelope detector having an output connected to a first input of a differential amplifier and a reference storage capacitor to a second input of the differential amplifier, the method comprising:
   in a calibration mode:
      coupling an input of the RF detector circuit to a reference potential;
      performing a reset operation of the voltage on the reference storage capacitor;
      charging the reference storage capacitor at a first rate until the differential amplifier output toggles and discharging the reference storage capacitor at a second lower rate until the differential amplifier output toggles, or discharging the reference storage capacitor at the first rate until the differential amplifier output toggles and charging the reference storage capacitor at a second lower rate until the differential amplifier output toggles; and
      storing the resulting voltage on the reference storage capacitor; and in a detection mode:
      coupling the input of the RF detector circuit to a signal to be detected.

13. A method as claimed in claim 12, wherein performing the reset operation comprises fully discharging the reference storage capacitor, and wherein the charging is carried out before the discharging and with a higher rate.

14. A method as claimed in claim 12, wherein charging the reference storage capacitor comprises driving a first current from a current source to the reference storage capacitor.

15. A method as claimed in claim 14, wherein discharging the reference storage capacitor comprises driving a second current from the reference storage capacitor to a second current source, wherein one current source delivers at least 50 times the current of the other current source.

\* \* \* \* \*